(12) United States Patent
Bilgin et al.

(10) Patent No.: US 8,538,713 B2
(45) Date of Patent: Sep. 17, 2013

(54) METHOD AND ARRANGEMENT FOR SAMPLING RATE CONVERSION

(75) Inventors: Can Bilgin, Konya (TR); Rakesh Gangarajaiah, Lund (SE); Michal Stala, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 355 days.

(21) Appl. No.: 12/964,969

(22) Filed: Dec. 10, 2010

(65) Prior Publication Data

US 2011/0144934 A1 Jun. 16, 2011

Related U.S. Application Data

(60) Provisional application No. 61/285,971, filed on Dec. 12, 2009.

(30) Foreign Application Priority Data

Aug. 10, 2010 (EP) ..................................... 10172339

(51) Int. Cl.
*G06F 19/00* (2011.01)

(52) U.S. Cl.
USPC ............................................. 702/66; 702/57

(58) Field of Classification Search
USPC ......... 702/57, 65, 66, 69–76, 78, 79; 341/54, 341/61, 123, 143; 708/290, 313
See application file for complete search history.

(56) References Cited

U.S. PATENT DOCUMENTS

| 6,208,671 B1 * | 3/2001 | Paulos et al. ................... 370/545 |
| 6,747,858 B1 * | 6/2004 | Sculley et al. ................... 361/61 |
| 6,778,600 B1 | 8/2004 | Karanovic |
| 7,102,547 B2 * | 9/2006 | Jensen ............................ 341/61 |
| 7,259,700 B2 | 8/2007 | Heeb |

OTHER PUBLICATIONS

Lagadec R et al: "A universal, digital sampling frequency converter for digital audio". International Conference on Acoustics, Speech &Signal Processing. ICASSP. Atlanta. Mar. 30-Apr. 1, 1981; [International Conference on Acoustics. Speech &Signal Processing. ICASSP]. New York, IEEE, US, vol. 6. Mar. 30, 1981 XP002295978.

* cited by examiner

*Primary Examiner* — Sujoy Kundu

(57) ABSTRACT

Re-sampling of a signal represented by a plurality of input samples is described. An output sample value is calculated for a desired time instant, $t_D$, between any two time instants of the input samples by performing a procedure that comprises selecting a current set of values from the input sample values. A new set of values is calculated by up-sampling the current set of values. A subset of values is selected from the calculated new set of values and the current set of values surrounding the desired time instant of the output sample value, whereupon the output sample value is calculated using at least one value of the selected subset of values. The calculation of a new set of values and the selection of a subset of values from the new set and the current set is iterated a specific number of times, wherein during the iteration the current set of values is set to the selected subset of values.

10 Claims, 10 Drawing Sheets

METHOD AND ARRANGEMENT FOR SAMPLING RATE CONVERSION

CROSS-REFERENCE TO RELATED APPLICATIONS

This application claims the benefit of U.S. Provisional Application No. 61/285,971, filed Dec. 12, 2009, the disclosure of which is hereby incorporated by reference.

TECHNICAL FIELD

The present invention relates in general to digital signal processing. More particularly, the present invention relates to digital signal processing involving re-sampling of an already sampled signal.

BACKGROUND

In many signal processing applications there is a need to perform more or less complex calculations on values representing the amplitude and phase of the signals that are involved. Needless to say, such calculations are typically very difficult to perform unless the signals are represented by sequences of digital values obtained by sampling procedures in, e.g., an analog-to-digital (A/D) converter.

Typically, an A/D converter provides a sequence of samples at one specific rate, i.e. at a sampling rate. Typically, the rate at which the analog signal is sampled is a predetermined setting of the A/D converter. However, in many situations it is desirable to obtain more than one representation of an analog signal, each at a different sampling rate. This can be done by applying several A/D converters in parallel on the analog signal. However, this is not very flexible, nor is it efficient in terms of use of calculation resources. It is hence desirable to provide a way in which an already sampled signal can be re-sampled at a different rate than an original sampling rate.

An ideal approach to re-sample an already sampled analog signal, at a new sampling rate different to the sampling rate used during the original sampling of the signal, is to reconstruct the analog signal from the original signal samples and re-sample it with the desired output rate to obtain new output samples. If samples at $x(nT_s)$ of an input signal $x(t)$ sampled at a rate of $F_s$, n being integer values, assuming that $x(t)$ is band limited to $F_s/2$, then by Shannon's sampling theorem $x(t)$ can be uniquely reconstructed from the samples $x(nT_s)$ using:

$$\hat{x}(t) = \sum_{n=-\infty}^{\infty} x(nT_s) h_s(t - nT_s) \equiv x(t) \quad (1)$$

where $$h_s(t) = sinc(F_s t) = \frac{\sin(\pi F_s t)}{\pi F_s t} \quad (2)$$

Equation 1 and equation 2 show that, for an ideal reconstruction of the digital samples, a filter with an impulse response same as that of a sampled sinc function is needed. Hence the analog signal can be reconstructed using the equations as follows:

$$x(t) = \sum_{n=-\infty}^{\infty} x(nT_s) sinc(t - nT_s) \quad (3)$$

$T_s$ is the input signal sampling period, i.e. the original sampling period. $x(nT_s)$ are the samples and $x(t)$ is the ideal reconstructed analog signal. Normalizing the input sampling period $T_s$ to "1", equation 3 reduces to $$x(t) = \sum_{n=-\infty}^{\infty} x(n) sinc(t - n) \quad (4)$$

In order to calculate the exact analog output at any given time u, all that is needed is to substitute the value of u in place of t in equation 4. Therefore the value at any instant of time on the wave can be calculated using:

$$x(u) = \sum_{n=-\infty}^{\infty} x(n) sinc(u - n) \quad (5)$$

This method of sinc convolution gives an ideal result, i.e. the samples that would be obtained if an analog reconstruction filter and a re-sampler at the desired output rate were used. The real problem with this method lies in the fact that an infinite number of samples are needed, as shown in the above equations. To overcome this problem, a windowed sinc function instead of using just a pure sinc function can be used. A Kaiser window with a particular value of beta (a parameter that characterizes the shape of the Kaiser window) typically gives good results.

One method for fractional sampling rate conversion is the Farrow filter, the basic structure of which is shown in FIG. 6. FIG. 6 illustrates a Farrow filter with a filter length of 4 and order of 3. The $u_{gen}$ unit is responsible for generating a variable delay (time units) between the desired sample and the input sample on the time scale. The polynomials described by the Farrow filter to calculate the output correspond to the polynomials that describe the different lobes of a sinc function. This relation is depicted in FIG. 6 where a sinc function with four lobes is shown with each lobe mapping to a respective arm of the Farrow filter. The coefficients of the polynomial used to approximate the lobes are mapped to the respective filter arm encircled using dashed lines. The un-filled points represent the input samples and the black point represents the output which is to be calculated. Since the output required is at a distance u from one of the input samples, the sum of weighted values of the four input samples is needed to represent the desired output correctly.

Using longer filters, i.e. using more lobes of the sinc function, results in better approximation of the samples as does using a higher order polynomial to approximate the sinc lobes. As discussed above, a Kaiser window can be used to mitigate the effects of finite length sinc function. The precise calculation of the fractional distance u between the desired output and one of the input samples is of utmost importance and the full multipliers used to compute the final result should be able to maintain the desired level of accuracy needed. The constant multipliers and adder widths can be adjusted depending upon the performance requirements.

The distance u may be calculated according to the following simple algorithm:

```
u = OSR; //Initialization of u - only done once
if(u<=0.5){
    u = u + OSR;
}
else{
    u = u - 1;
}
``` where OSR is the over sampling ratio defined as the desired output sampling rate divided by the sample rate of the input samples $T_s$.

SUMMARY

Embodiments of the present invention provide, in a first aspect, a method in a signal processing device of re-sampling a signal represented by a plurality of input samples. The method comprises calculating an output sample value for a desired time instant, $t_D$, between any two time instants of the input samples by performing a procedure that comprises selecting a current set of values from the input sample values. A new set of values is calculated by up-sampling the current set of values. A subset of values is selected from the calculated new set of values and the current set of values surrounding the desired time instant of the output sample value, whereupon the output sample value is calculated using at least one value of the selected subset of values. The calculation of a new set of values and the selection of a subset of values from the new set and the current set is iterated a specific number of times, wherein during the iteration the current set of values is set to the selected subset of values.

By re-sampling in such a manner it is possible to obtain a sampling rate conversion that is efficient, for example in terms of use of processing power. In fractional sampling rate conversion it is necessary to compute new sample values at specific distances between the original input samples, i.e. at specific desired time points. A "brute force" method to obtain the correct result is to up-sample the input signal to a much higher sampling rate, and then pick values that are closest to the desired time points. In contrast to such "brute force" methods, the method summarized above up-samples the input samples and then picks only a subset of the values to be up-sampled again. The "window" which determines the subset of values changes with each iteration, thereby up-sampling only points which are close to the desired time point or in other words up-sampling only the region of interest, instead of a whole delay chain in which samples are stored.

The calculation of a new set of values may comprise calculating values at time points corresponding to a number of points between two consecutive samples in the current set of values. The number of points may correspond to any integer division factor greater than or equal to two, for example at time points corresponding to mid-points between two consecutive samples.

In other words, calculation efficiency is obtained by using a number of points corresponding to an integer division factor.

The calculation of a new set of values may be done according to the equation:

$$x'(i) = \sum_{m=0}^{j/2-1} (x(l-i-m) + x(l-i+j-m-1)) \cdot c_{m+1} \quad (6)$$

where x'(i) is the new set of values, x(l) is the current set of values, j is the number of values in the current set of values, and $c_{m+1}$ are weighting values. These weighting values coefficients may be values of an ideal sinc function at $\square+0.5$ where $\square \in Z$. Furthermore, the weighting values coefficients may be values of a Kaiser windowed sinc function.

In other words, simplicity and efficiency during calculations is obtained when using a number of points corresponding to a division factor of two. Furthermore, when implementing in hardware, a smaller and a more flexible design can be obtained.

The selection of a subset of values from the calculated new set of values and the current set of values surrounding the desired time instant ($t_D$) of the output sample value may be such that values at time instants closest to the desired time instant are selected. For example, the selection of values at time instants closest to the desired time instant may performed according to the equation:

$$[x(l-1), x'(i), x(l-2), x'(i-1), \ldots, x'(i-j+2)] \text{ if } u<0.5, \quad (7)$$

and the selection of values at time instants closest to the desired time instant may performed according to the equation:

$$[x'(i), x(l-2), x'(i-1), \ldots x'(i-j+2), x(l-j)] \text{ if } u \geq 0.5, \quad (8)$$

where x'(i) is the new set of values, x(l) is the current set of values, j is the number of values in the current set of values, and u is the discrete normalized time instant of the desired time point.

In other words, simplicity and efficiency during calculations is obtained and, when implementing in hardware, a smaller and a more flexible design can be obtained.

The calculation of the output sample value may comprise calculating an average value of at least two values of the selected subset of values or performing a bilinear interpolation using at least two values of the selected subset of values.

In other words, when a desired time point does not correspond to a time point that can be represented by a sum of inverse powers of the division factor, a calculation efficient average calculation or an interpolation may be performed.

The selection of a current set of values from the input sample values, the calculation of a new set of values, the selection of a subset of values and the calculation of the output sample value may be iterated such that, in each iteration, the selection of a current set of values from the input sample values involves selection of at least one input sample value not previously selected and discarding a corresponding at least one input sample value previously selected.

That is, by iterating the process of re-sampling for input samples at an input sample rate, it is possible to provide any desired rate of output samples.

Embodiments of the present invention provide, in a second aspect, a signal processing device for re-sampling a signal represented by a plurality of input samples, comprising processing circuitry and memory circuitry configured to calculate an output sample value for a desired time instant ($t_D$) between any two time instants of the input. processing circuitry and memory circuitry is configured to select a current set of values from the input sample values, calculate a new set of values by up-sampling the current set of values, whereby the number of values in the new set is larger than the number of values in the first set, select a subset of values from the calculated new set of values and the current set of values surrounding the time instant of the output sample value, and calculate the output sample value using at least one value of the selected subset of values. The processing circuitry and memory circuitry is also configured to iterate, a specific number of times, the calculation of a new set of values and the selection of a subset of values from the new set wherein during the iteration the current set of values is set to the selected subset of values.

With respect to the second aspect, embodiments, effects and advantages correspond to those described above in connection with the first aspect.

DETAILED DESCRIPTION

Figure 1:
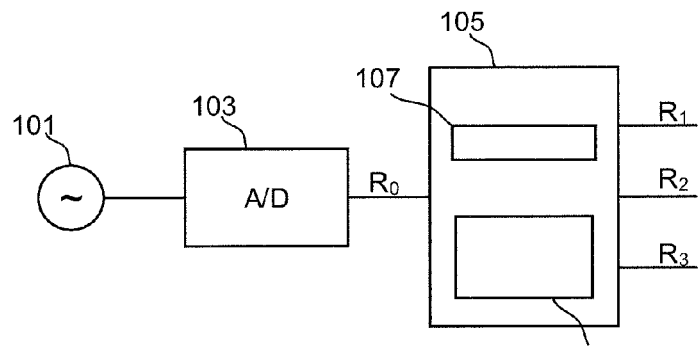
FIG. 1 illustrates a block diagram of a system comprising a re-sampling device.

In FIG. 1 an analog signal source 101 is connected to an analog-to-digital converter, A/D converter 103. As is known to the skilled person, the A/D converter 103 generates a sequence of digital samples of the analog signals provided by the signal source 101. The rate at which the A/D converter 103 provides the sample sequence is denoted $R_0$. The A/D converter 103 is connected to a signal processing device 105 that comprises processing circuitry 107 and memory circuitry 109. The memory circuitry 109 is to be understood to comprise any appropriate type of memory, including registers, as is known to the person skilled in the art. The sample sequence at rate $R_0$ is processed in the signal processing device 105 as will be described in detail in the following. As indicated in FIG. 1, the signal processing device 105 is capable of re-sampling the A/D converted signal and provide sample sequences at different sampling rates, for example at rates $R_1$, $R_2$ and $R_3$ as indicated.

Figure 2:
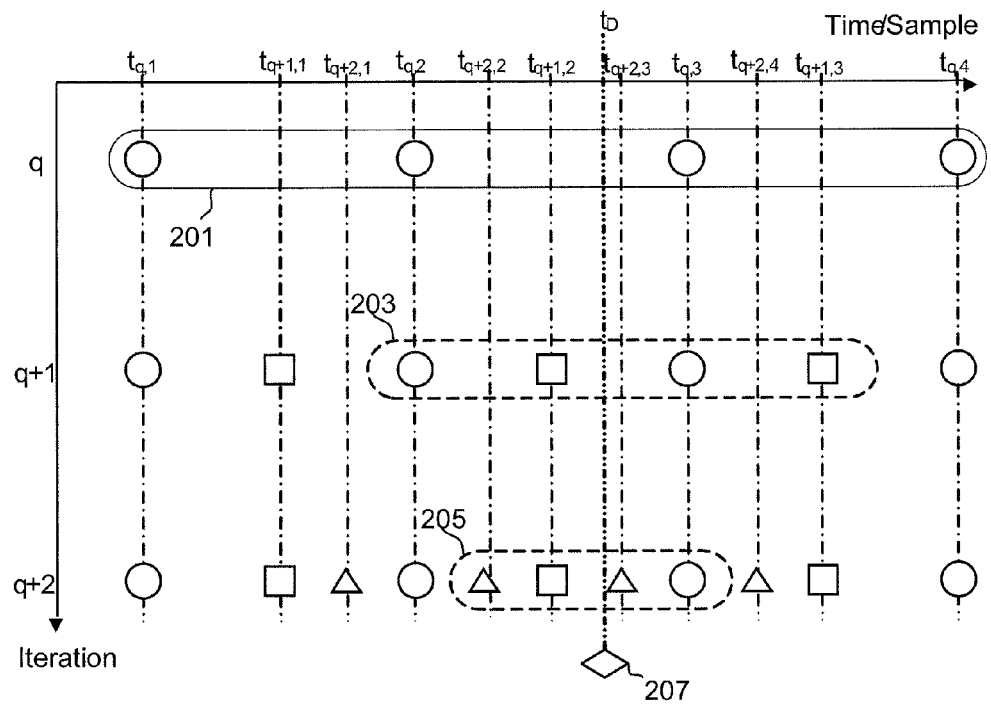
FIG. 2 is a diagram illustrating a re-sampling iterations according to an embodiment of the present invention.
Figure 3:
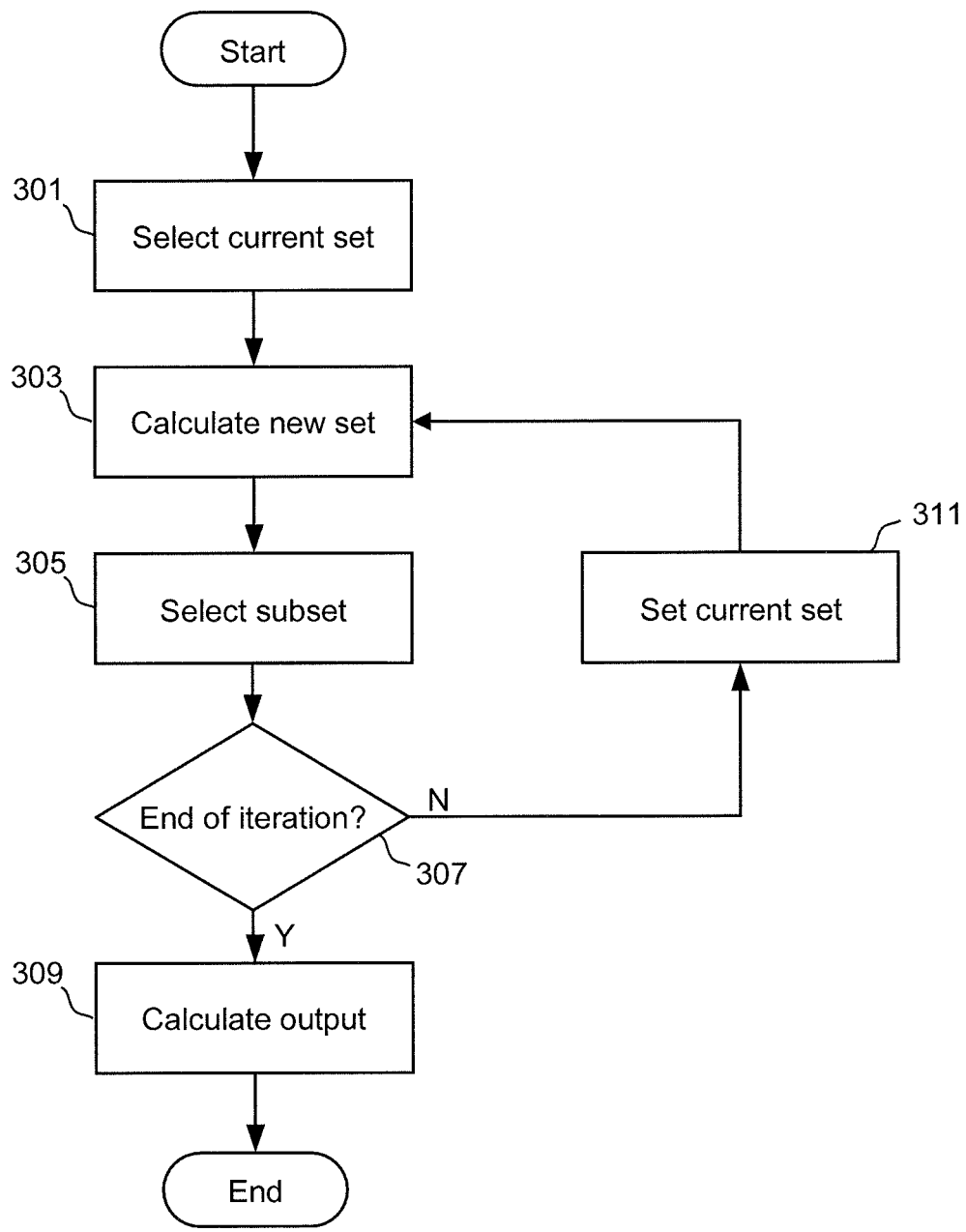
FIG. 3 is a flow chart illustrating a re-sampling method according to an embodiment of the present invention.

FIG. 2 and FIG. 3 illustrate a method of re-sampling a sequence of input samples, according to an embodiment of the present invention. In FIG. 2, sample values are represented by sets of symbols in the form of circles, squares and triangles. Circles represent a set of original input sample values of a sampled analog signal, for example samples provided by the A/D converter 103 in FIG. 1 at a rate $R_0$. Squares and triangles represent sets of calculated sample values. Each sample represents a value at a specific time point t, as indicated on the time axis of the diagram, and at three iteration stages: q, q+1 and q+2. Dashed lines indicate sets 201, 203, 205 of sample values during the three iteration stages. After iteration stage q+2, an output sample value 207 is obtained at a desired time point $t_D$, as will be described in the following. Typically, the sample values of the current set 201 are stored in temporary memory often denoted "delay line", such as the memory 109 in the device 105 in FIG. 1.

The method commences in a selection step 301, in which a current set 201 is selected from the input sample values. Then a new set of values is calculated by up-sampling the current set of values in a calculation step 303. This calculated new set is the samples represented by square symbols. The specific process of calculation of the new values will be described in detail below. A subset of values 203 is then selected from the calculated new set of values and the current set of values. This selection is such that sample values surrounding the desired time instant of the output sample value are selected. The specific process of selecting these values will be described in detail below. The output sample value 207 is calculated in a calculation step 309 using at least one value of the selected subset of values.

In order to obtain an output value 207 at the desired time point $t_D$, the procedures of calculation in step 303 of a new set of values and the step of selecting 305 a subset of values from the new set is iterated a specific number of times. During the iteration a new subset 205 is selected and the current set of values is set to the selected subset of values in a setting step 311. The decision on whether or not to iterate is performed in a decision step 307. The details regarding this will be described in more detail below.

In the following, an iterative method as summarized above will be described in some detail. The method utilizes the properties of the sinc function. To up-sample an input sequence of samples by a factor of two the values of the ideal sinc function at $\pm x+0.5$, where x is an integer, are used as weights for the input samples to calculate the ideal output. It is to be noted that, in general, up sampling by a factor F can be done by taking values of the ideal sinc function at $\pm x+1/F$. However, as discussed above, using an infinite length sinc functions is typically not practical and hence a windowed sinc function is used.

Figure 4:
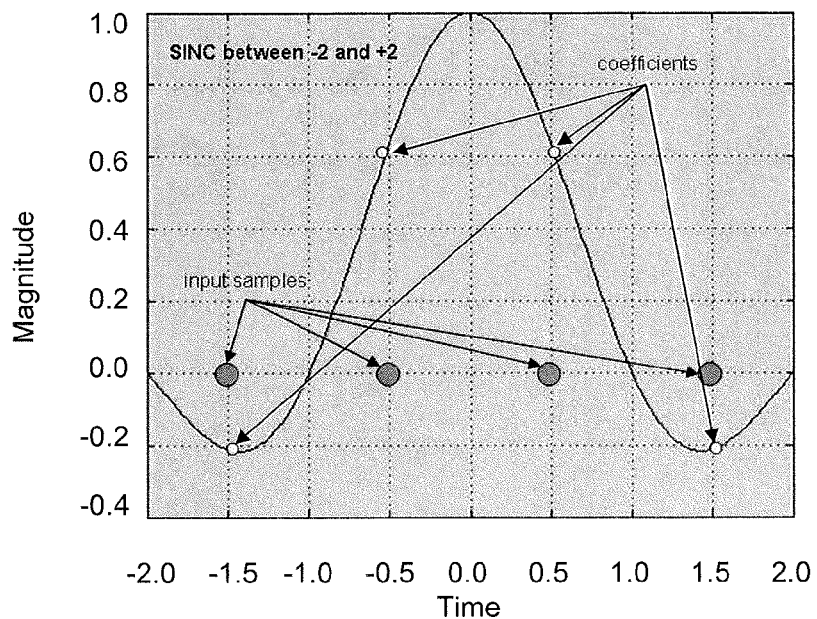
FIG. 4 is a graph of a sinc function and mapping of c coefficients.

From Ideal sinc sampling theory, using an infinite sinc wave sampled at $\pm x+0.5$, to calculate a value on an input wave in between two samples, convolution shown in equation 1 can be performed. FIG. 4 shows values of the sinc function at $-1.5$, $-0.5$, $0.5$ and $1.5$, which are used as coefficients with input sample values placed at $-1.5$, $-0.5$, $0.5$ and $1.5$ on the x-axis to compute an output value at instant 0 on the x-axis, corresponding to a desired time point $t_D$.

As discussed above, the use of an unlimited number of samples to compute output sample values is impractical, at least from a hardware perspective. Hence a windowed sinc function is used. Using a rectangular window to compute the output sample values produces a large error. However, using a Kaiser window of specific beta and length (beta and length being the characteristic parameters of the Kaiser window, as the skilled person will realize) reduces the error of the calculated value. Hence In the example shown in FIG. 4, using coefficients from a Kaiser windowed sinc gives better results than using values from the sinc function at $\pm x+0.5$ as coefficients.

Figure 5:
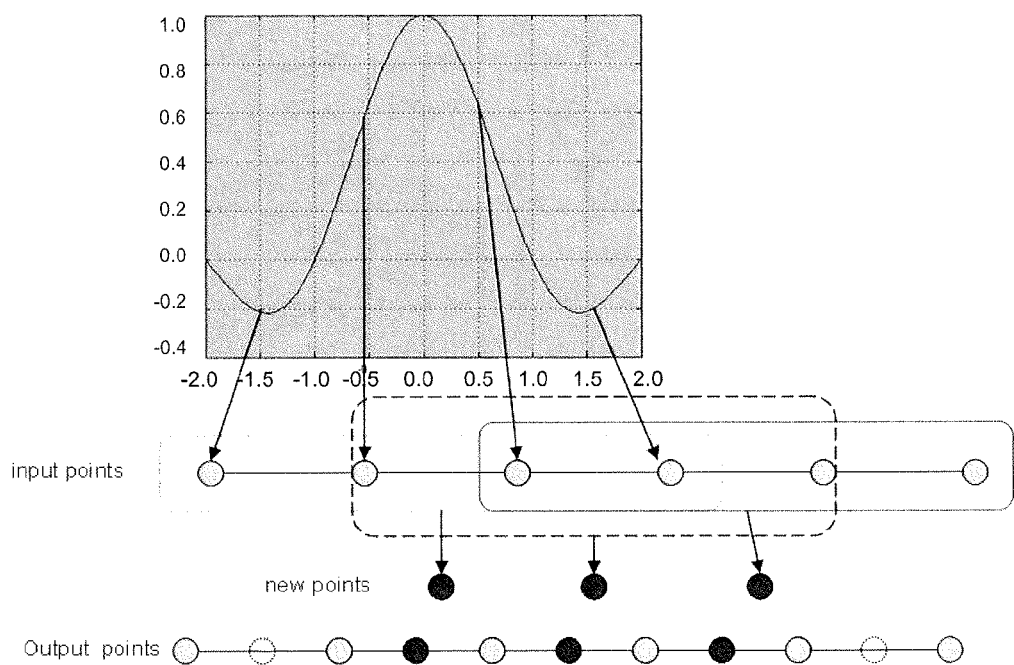
FIG. 5 illustrates use of sinc function coefficients.

However, when doing fractional re-sampling, values for points not only at a distance of 0.5, but at all the possible distances between any two input samples need to be computed, ideally. FIG. 5 illustrates an example where six input points are used to compute values for three new points. To calculate values for each mid-point the method described in connection with FIG. 4 is used, where four input points and four coefficients are used three times, i.e. iterated such that for each iteration a new input sample value is used and an old input sample value is discarded. Once values for these new mid-points are calculated, they can be reused to perform iterations as shown in FIG. 2, to produce four times the number of sample values. Iterating again produces values which are at distance of 0.125 units from the input sample values. By repeating these iterations, values for points which are at distances of inverse powers of two can be computed. Therefore after n number of iterations with the above described method, the resolution or distance between any two samples would be $½^n$. Hence a value for any point between two input samples can be computed by increasing the number of iterations n with any integer division factor F greater than or equal to two.

Equations 6-8, introduced above, illustrate the procedure to generate the values for "middle" points, x'(i), for one iteration, in a general form:

$$x'(i) = \sum_{m=0}^{j/2-1} (x(l-i-m) + x(l-i+j-m-1)) \cdot c_{m+1} \qquad (6)$$

where x(l) is the original sample values, j is the filter length (i.e. the number of values in the set of values used in the current iteration stage), and $c_{m+1}$ are coefficients (i.e. weighting values) from the sinc function as discussed above.

The combination of the original sample values and the calculated "middle" point values is performed in a general manner by using:

$$[x(l-1),x'(i),x(l-2),x'(i-1), \ldots ,x'(i-j+2)] \text{ if } u<0.5 \qquad (7)$$

$$[x'(i),x(l-2),x'(i-1), \ldots x'(i-j+2),x(l-j)] \text{ if } u \geq 0.5 \qquad (8)$$

where u is the discrete normalized time instant of the desired time point.

For each new iteration stage (i.e. q in FIG. 2), this series of points, becomes the new x(l). This algorithm assume that one middle point value is calculated (per two original values). This may be generalized further by not limiting the algorithm to only generate one middle point value per two original points, but several values between two points. This will be discussed further below.

This method of using a division factor F that is 2 is advantageous when computing sample values which are at a distance of a power of 2, e.g. 0.5, 0.25, 0.125, 0.0625 etc. An extra difficulty occurs when computing points which are not at a distance that can be represented by a sum of inverse powers of division factor. If the point can not be represented as described above, at the end, of certain number iterations two points which are on either side of the desired output will be obtained. At this stage, either the average of the values for the two points can be taken to estimate the result or, bilinear interpolation can be done to estimate the required value. By using bilinear interpolation, the number of iterations required to compute a value for a point with a certain error reduces by a large amount. This is discussed in more detail in the following paragraphs.

A description of simulations of the method described above will now follow. Comparisons will be made with a Farrow filter. An input frequency $f_1$ was chosen as a multiple of a sampling rate of a wireless standard. An output frequency $f_2$ was chosen as the sampling rate of another standard, resulting in an over sampling ratio, $R=f_1/f_2 \approx 1.7$. These values for $f_1$ and $f_2$ give non-trivial value of R between one and two, which is considered to be a suitable range for performance simulations. Simulations to compute the signal-to-noise ratio (SNR) were performed to measure the sampling rate conversion (SRC) performance for a given input wave. The SNR represents the relation between the error introduced by the SRC, and a reference in the form of an ideally re-sampled signal:

$$SNR=10*\log_{10}(\text{mean}(\text{abs}(\text{reference})^2)/\text{mean}(\text{abs}(\text{error})^2)) \qquad (9)$$

For example, in the 3GPP LTE standard, a typical maximum SNR is around 30 dB, where it is assumed that the SNR saturates in good channel conditions. The configurations for these performance simulations were chosen aiming at a performance above 30 dB, not to introduce more error than the channel itself, and not affect the overall performance.

Farrow Filter Simulation

Figure 7:
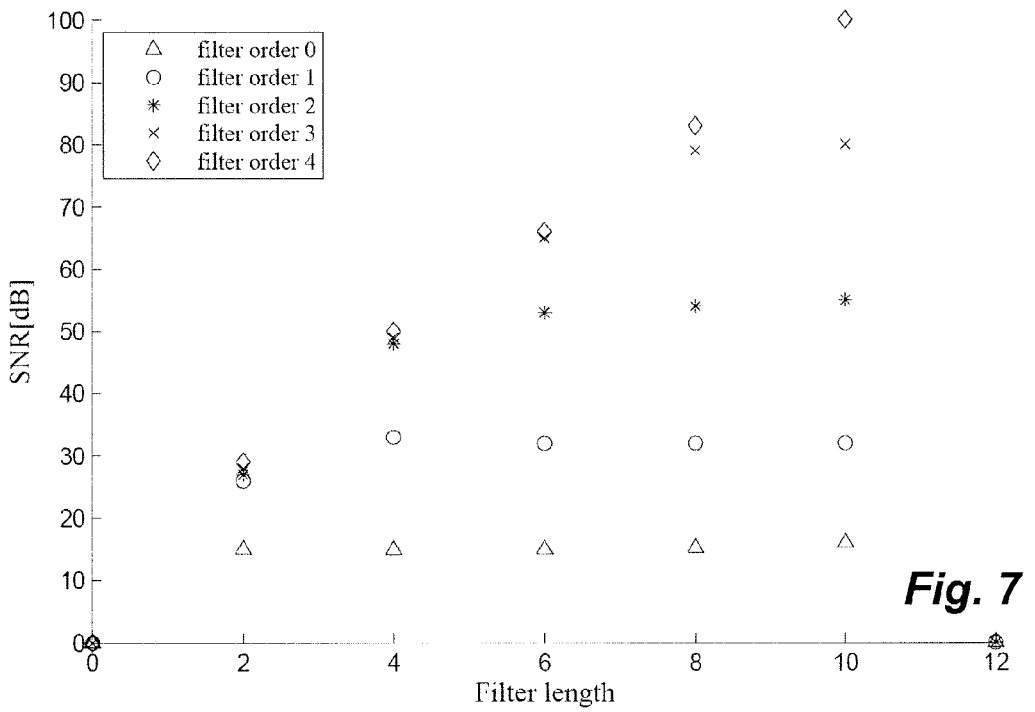
FIG. 7 is a graph showing performance of a Farrow filter.

Two design parameters that may be varied in the Farrow structure are the filter length and the polynomial order. Different combinations of values for these parameters are shown in FIG. 7. It is observed that the filter length only gives better results up to a certain point for a particular polynomial order. Longer filter length mean that a larger portion of the sinc function is used for coefficient generation. The contribution from input samples far from the desired output sample do not contribute as much as the closest ones, due to the shape of the sinc function and the performance saturates at some point.

Figure 8:
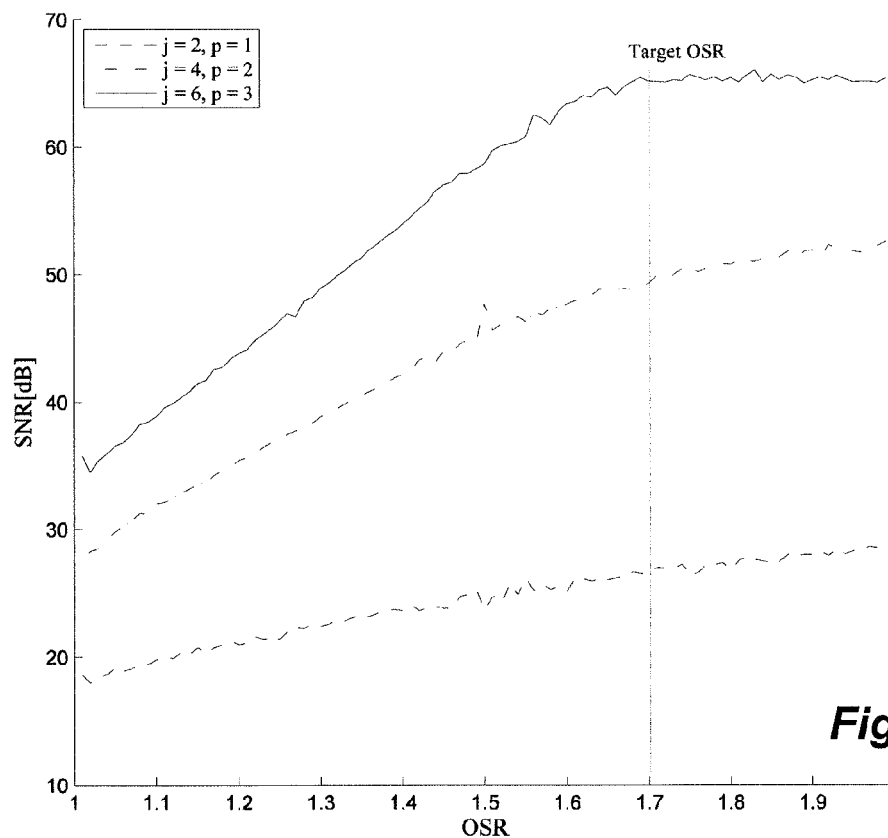
FIG. 8 is a graph showing performance of a Farrow filter.

The performance increases with the polynomial order since the lobes of the sinc function are modelled more accurately. The graphs in FIG. 8 show the SNR for various filter lengths j and polynomial orders p. To obtain the graphs, the coefficients were optimized for $R \approx 1.7$ using sine coefficient mapping. The computed values were compared with the reference samples for each value of R. Moreover, it is shown that this filter may be used with other OSR values than $R \approx 1.7$, with either lower or similar performance than designed for. The simulation results show that the SNR saturates at the OSR that the design was optimized for. The performance for OSR values lower than the optimal one decrease linearly. The occasional spikes in the plots show that certain values of OSR are 'easier' for the algorithms to handle. This phenomenon is typically seen where R=1.25, R=1.5, R=1.75. The output and input points will coincide very often in these cases, since the u value will reoccur periodically with a high recurrence rate.

Iterative Sampling Rate Converter (ISRC)

The simulations were performed by varying the configuration of the ISRC. One design option, similar to the Farrow structure, is the filter length. Another design parameter is the number of iterations the ISRC needs to perform, and a third design option is whether to use averaging or bilinear interpolation at the final step.

Figure 9:
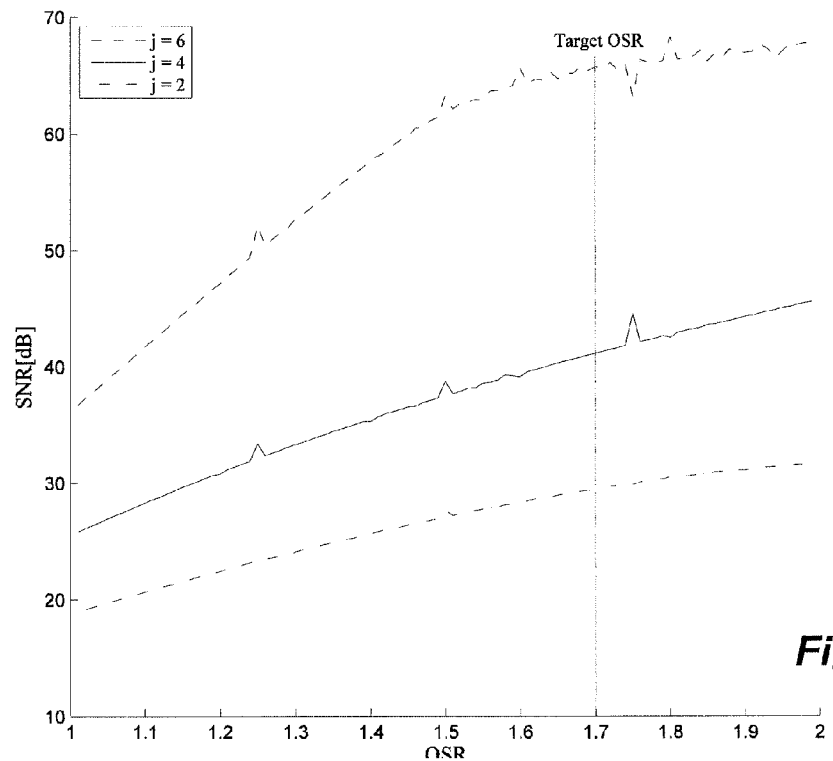
FIG. 9 is a graph showing performance of iterative sampling rate conversion.

The coefficients for the iterative sinc re-sampling filter for filter lengths of 2, 4 and 6 were optimized for $R \approx 1.7$. The performance plot is obtained by varying OSR from one to two, as shown in FIG. 9. These results show similar properties as in the Farrow case, see FIG. 8. The graphs in FIG. 9 indicate saturation at the OSR value which the filter was optimized for. This can be observed especially for designs with higher filter order, both for the Farrow case and the ISRC case.

Figure 10:
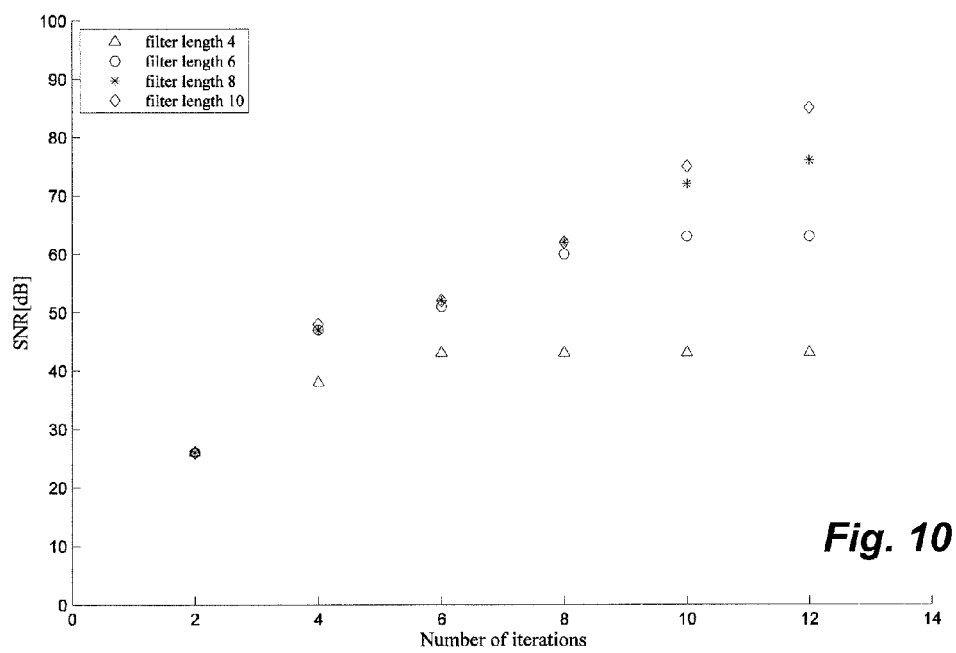
FIG. 10 is a graph showing performance of iterative sampling rate conversion.
Figure 11:
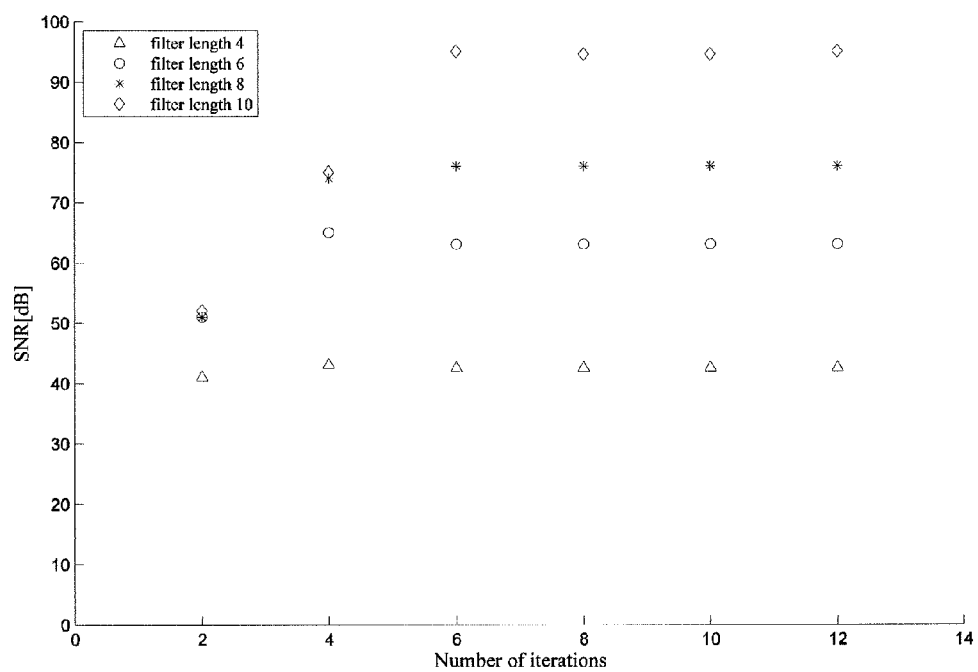
FIG. 11 is a graph showing performance of iterative sampling rate conversion.

FIG. 10 presents simulation results obtained by using simple averaging with different configurations on filter length and the number of iterations. FIG. 11 presents simulation results obtained when bilinear interpolation used. It is observed that the use of bilinear interpolation instead of averaging reduces the number of iterations by about a half, in order to reach equal performance. Moreover, FIGS. 10 and 11 show that an increase in filter length improves the performance of the ISRC algorithm. An improvement of performance can also be obtained by increasing the number of iterations. As FIGS. 10 and 11 show, this is valid up to a certain point in terms of filter length. An error is introduced for each mid point calculated, due to the use of a finite number of points from the sinc wave and the limitation of the coefficients word length. For each iteration, new points are calculated using a subset of the original and calculated points (as described in detail above). As a result, the error accumulates for each iteration and after a certain error bound an upper performance is reached. The accumulated error may be equal or larger than the performance increase, and they may cancel each other so that performance saturates, as the number of iterations increase.

One approach is to optimize the coefficients for a particular value of OSR and evaluate the performance for other OSR values of interest. In order to get the highest performance in terms of SNR while keeping the complexity at the lowest, it is recommended to optimize the design for the lowest OSR. This is true if the SNR requirements are the same for all targeted values of R (OSR). Furthermore, in standards that do not require fractional sample rate conversion (FSRC), the OSR is set to an integer value and no FSRC is needed in such cases.

Implementation in Hardware

Figure 12:
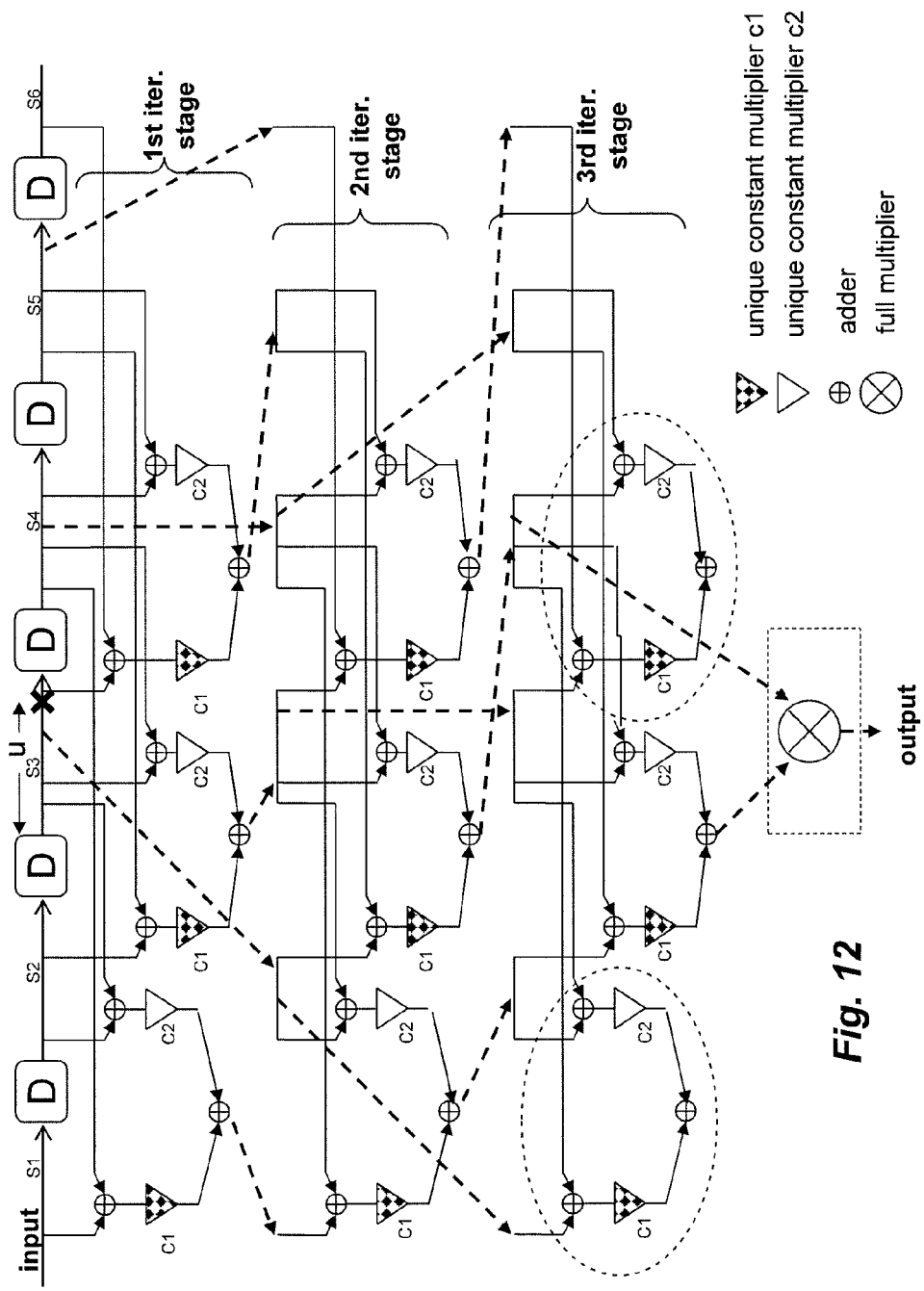
FIG. 12 illustrates a block diagram of an iterative sampling rate converter according to an embodiment of the present invention.

A direct mapped architecture of the ISRC with a filter length of four is depicted in FIG. 12 in accordance with an embodiment of the present invention. In this implementation three iterations are performed before an output sample is obtained. During the last iteration bilinear interpolation is applied to compute the output sample values, which reduces the number of required iterations, as previously demonstrated. The number of iterations and the filter length is fixed based on the targeted performance, i.e., SNR. The filter is composed of five delay elements D, which results in a delay chain length of six, where six input samples S1-S6, are available. A length of six has been chosen as a small and realistic example, to illustrate the working principle and the different possible hardware implementations for the iterative sinc re-sampler. These six input samples may be utilized to calculate three points at distance of 0.5 time units from the original points.

The filter length, j of this filter is defined as d/2+1 where d is the chosen delay line length. Two of the constant multiplier sets, encircled by dashed lines, are not used in the last iteration, since only one point needs to be computed. For a chosen filter length, any iteration would require a certain set of constant multiplier sets, where the number of these sets is determined by d/2. Each iteration employs three equivalent sets (j−1) of constant multipliers with coefficients c1 and c2 from the sinc function as described above. sinc functions symmetry is used to reduce the number of unique constant multipliers. These three sets are utilized to calculate the midpoints between some of the input samples. To calculate a sample at an instant marked by 'X' on the original input delay line, three iterations are performed.

In the first iteration stage, the midpoints of the input samples are calculated. Depending on the position of 'X', i.e., whether 'X' is at a distance smaller than 0.5, i.e., u<0.5, units from one of the inputs or not, the correct combination of input and estimated midpoint samples are selected to be passed onto the second iteration stage. This is indicated by the dashed arrows. In practice, as will be discussed in more detail below, this may be realized by connecting the outputs of the adders to multiplexers controlled by a comparator having u as an input. After the correct samples are determined, a second iteration stage is performed, which produces samples midway between each input.

Figure 6:
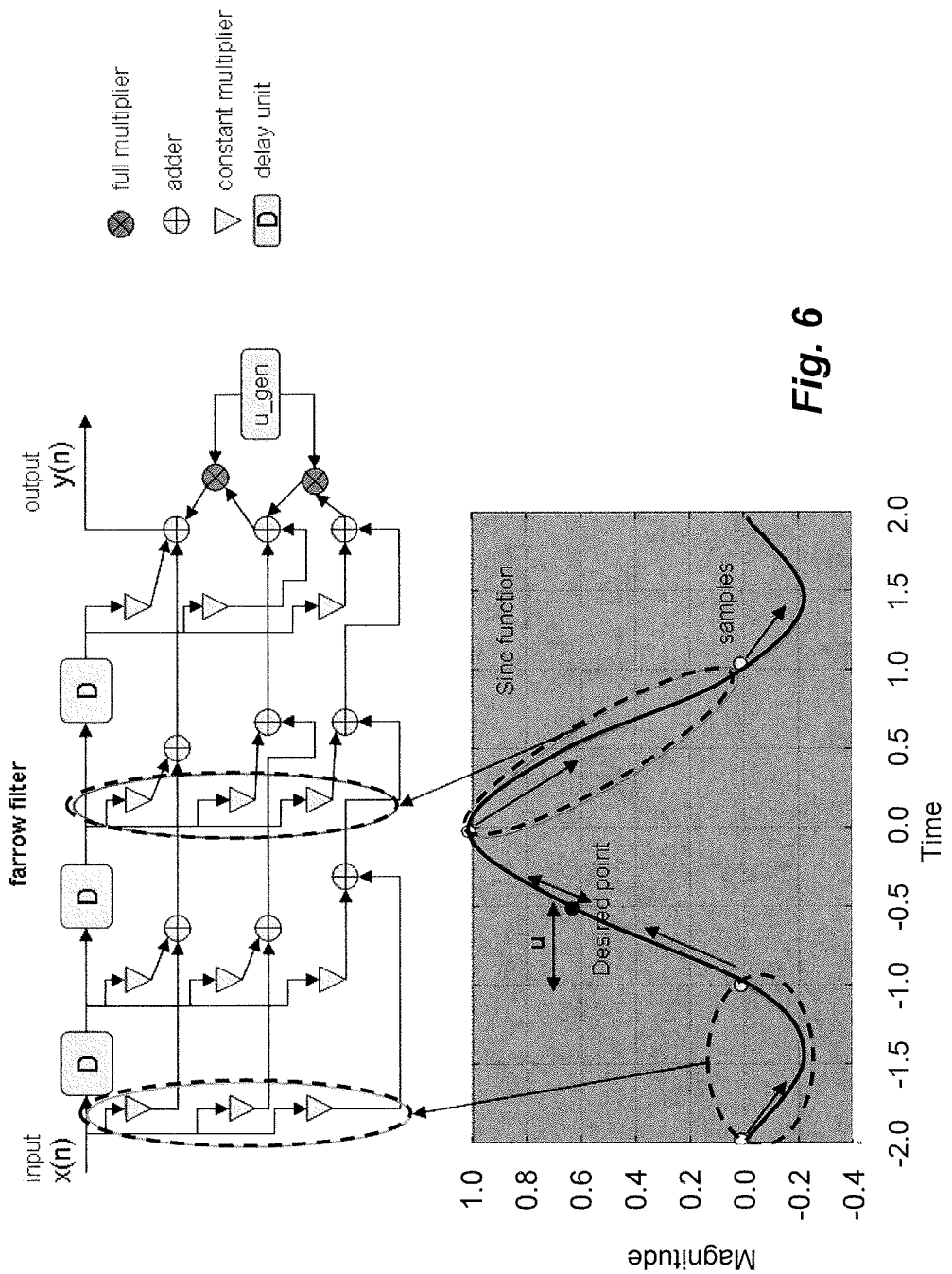
FIG. 6 illustrates schematically a Farrow filter.

In terms of evaluating the area needed for such a hardware implementation, several different configurations have been chosen for synthesis, both for a Farrow structure (c.f. FIG. 6) and the Iterative Sampling Rate Converter of FIG. 12. A Farrow filter with filter length of two and order of one is used as reference and is used to normalize the area values. The normalized areas obtained and the performances of the filters are presented in the following table:

| Filter length | Farrow filter | | | Iterative sampling rate converter | | |
| --- | --- | --- | --- | --- | --- | --- |
| | SNR (dB) | Area | Number of multipliers | SNR (dB) | Area | Number of multipliers |
| 2 | 29 | 1.4 | 2 | 29 | 0.85 | 1 |
| 4 | 49 | 2.6 | 2 | 39 | 2.1 | 1 |
| 6 | 65 | 8.4 | 3 | 63.5 | 6.3 | 1 |

The ISRC, for all designs, is implemented as a direct mapped architecture, in order to be able to make a fair comparison with the Farrow filter. The performance threshold was set to 30 dB plus additional margin. It is shown that the area cost of the iterative sinc filter is lower compared to a conventional Farrow filter in the selected designs. The performance is comparable in the designs where the filter length is two and six. In the case where the filter length is four, the Farrow filter gives a significantly better performance. It is shown that number of generic multipliers in the Farrow filter increases with incrementing filter length, whereas in the ISRC the number of multipliers remains unchanged.

The silicon cost, i.e. the area, may be reduced even further by re-using the same hardware structures during each iteration. Additional logic is required to multiplex the signals and to store intermediate results in each iteration. This approach requires j−1 sets of the basic structure, as will be discussed below in connection with FIG. 13. However, to maintain equal throughput the clock of the folded structure need to be operated at a rate which is three times higher compared to the clock of a the direct mapped implementation, according to the architecture in FIG. 12.

Figure 13:
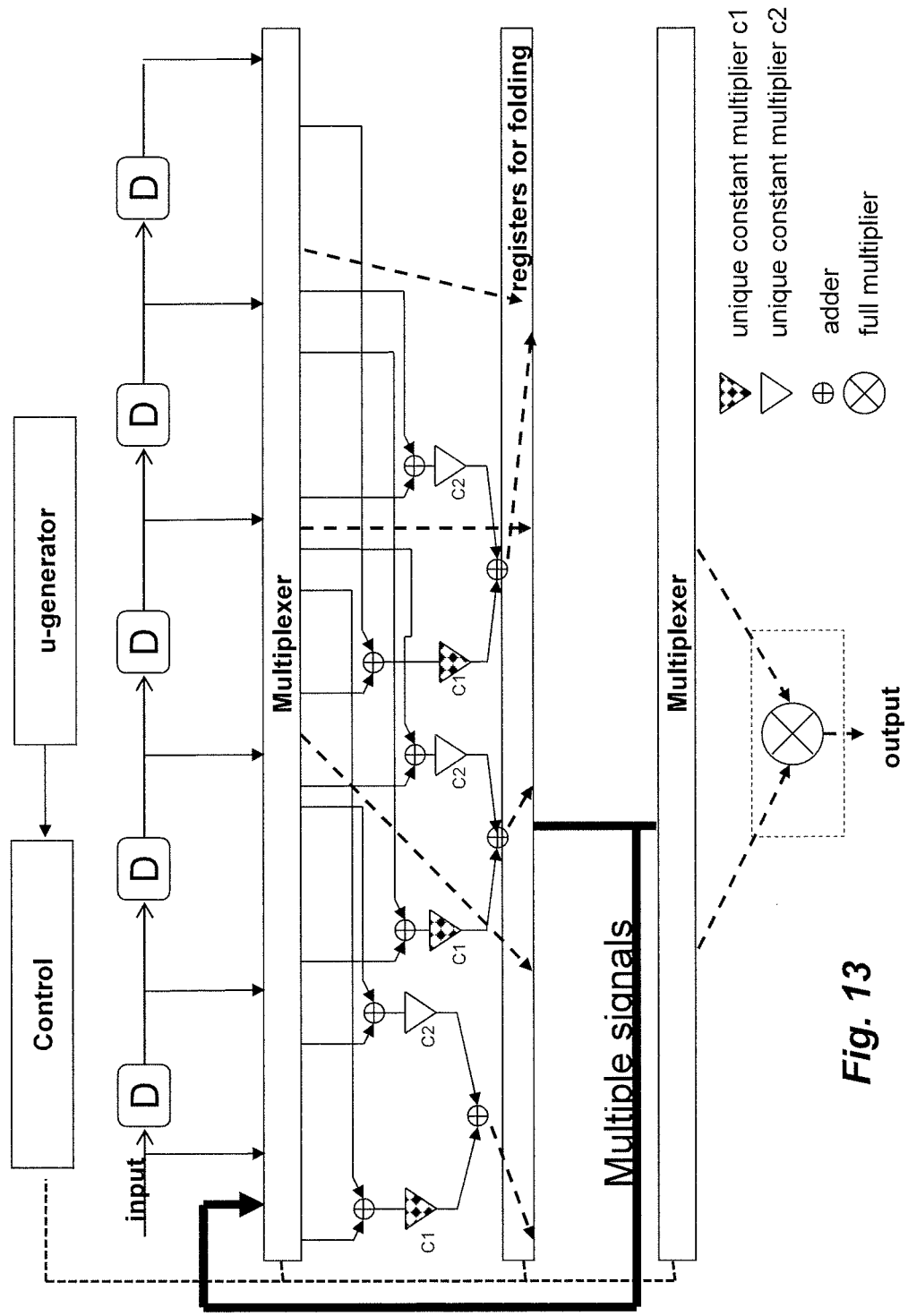
FIG. 13 illustrates a block diagram of a folded iterative sampling rate converter according to an embodiment of the present invention.

FIG. 13 illustrates, similar to the architecture in FIG. 12, an ISRC with a filter length of four, in accordance with an embodiment of the present invention. However, instead of three separate iteration stages, the architecture of FIG. 13 is folded and hence comprises folding registers and multiplexers that replace the plurality of iteration stages as illustrated in FIG. 12. The folding registers hold the results from the calculation of the midpoints between samples and the multiplexers, under the control of a control unit, provide appropriate sample values to the midpoint calculating multipliers and adders. A generator connected to the control unit provides the value for u that is to be used for the iteration.

Figure 14:
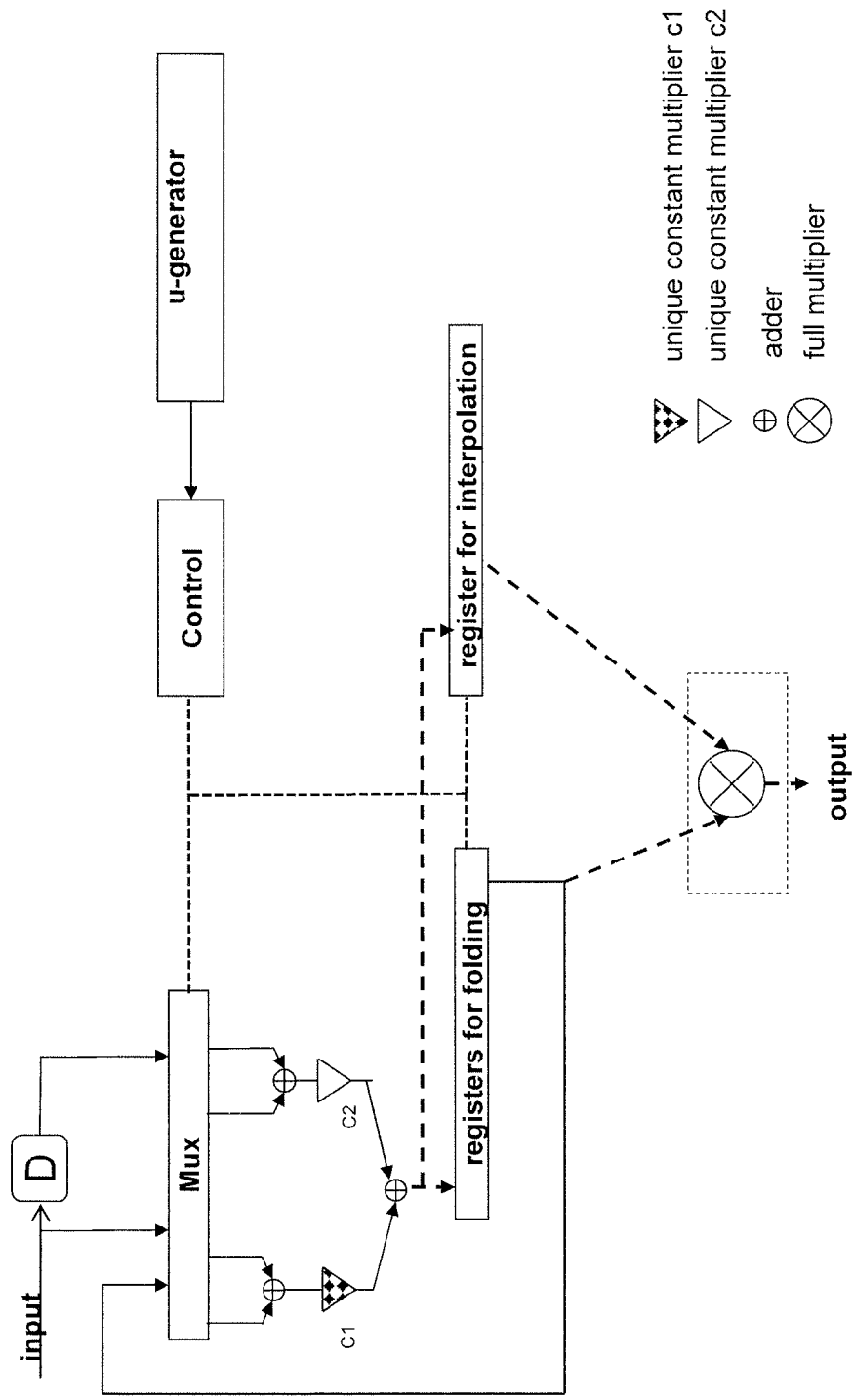
FIG. 14 illustrates a block diagram of a folded iterative sampling rate converter according to an embodiment of the present invention.

Moreover, it is possible to increase the folding factor further. That is, it is possible to use only one set of the basic structure of multipliers and adders instead of separate explicit sets making up the separate iteration stages as shown in FIG. 12. Consequently, such a folded architecture has to be operated at a rate which is correspondingly higher than the operating rate of a parallel architecture such as that of FIG. 12. This is illustrated in FIG. 14, where an ISRC architecture comprises one basic structure of multipliers and adders, in accordance with an embodiment of the present invention. Samples are provided to this one basic structure by means of a multiplexer. The multiplexer multiplexes input samples and estimated samples that are output via folding registers connected to the output of the one basic structure. The final output sample is obtained by means of output from the folding registers and a register for interpolation. The multiplexer and the registers are controlled by a controller that is fed with u values from a u generator, similar to that of the architecture illustrated in FIG. 13.

In contrast, folding of a Farrow structure is possible only by a factor of two, utilizing the symmetric coefficients, however, any further folding is difficult to achieve due to the unique multipliers.

The various methods as illustrated in the figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skill in the art having the benefit of this disclosure. It is intended that the invention embrace all such modifications and changes and, accordingly, the above description to be regarding in an illustrative rather than a restrictive sense.

The invention claimed is:

1. A method in a signal processing device of re-sampling a signal represented by a plurality of input sample values, comprising calculating an output sample value for a desired time instant between any two time instants of the input samples by performing a procedure comprising:
    selecting, by a processor, a current set of values from the input sample values,
    calculating, by the processor, a new set of values by up-sampling the current set of values, wherein the calculating the new set of values further comprises
        calculating values at time points corresponding to a number of points between two consecutive samples in the current set of values, said number of points corresponding to any integer division factor greater than or equal to two,
        calculating values at time points corresponding to midpoints between two consecutive samples in the current sent of values, and
        the calculation of a new set of values is done according to the equation:

$$x'(i) = \sum_{m=0}^{j/2-1} (x(l-i-m) + x(l-i+j-m-1)) \cdot c_{m+1}$$

where:
        x'(i) is the new set of values,
        x(l) is the current set of values,
        j is the number of values in the current set of values, and
        cm+1 are weighting values;
    selecting, by the processor, a subset of values from the calculated new set of values and the current set of values surrounding the desired time instant of the output sample value,
    calculating, by the processor, the output sample value using at least one value of the selected subset of values, and wherein:
    the calculation of a new set of values and the selection of a subset of values from the new set and the current set of is iterated a specific number of times, wherein during the iteration the current set of values is set to the selected subset of values.

2. The method of claim 1, wherein the coefficients cm+1 are values of an ideal sinc function at α+0.5 where α∈Z.

3. The method of claim 1, wherein the coefficients cm+1 are values of a Kaiser windowed sinc function.

4. The method of claims 1, wherein:
    the selection of a subset of values from the calculated new set of values and the current set of values surrounding the desired time instant of the output sample value is such that values at time instants closest to the desired time instant are selected.

5. The method of claim 4, wherein:
    the selection of values at time instants closest to the desired time instant is performed according to the equation:

$[x(l-1), x'(i), x(l-2), x'(i-1), \ldots, x'(i-j+2)]$ if $u<0.5$, and
        wherein:

the selection of values at time instants closest to the desired time instant is performed according to the equation:

$[x'(i), x(l-2), x'(i-1), \ldots x'(i-j+2), x(l-j)]$ if $u \geq 0.5$,
        where:
            x'(i) is the new set of values,
            x(l) is the current set of values,
            j is the number of values in the current set of values, and
            u is the discrete normalized time instant of the desired time point.

6. The method of claims 1, wherein:
    the calculation of the output sample value comprises calculating an average value of at least two values of the selected subset of values.

7. The method of claims 1, wherein:
    the calculation of the output sample value comprises performing a bilinear interpolation using at least two values of the selected subset of values.

8. The method of claim 1, wherein:
    the selection of a current set of values from the input sample values,
    the calculation of a new set of values,
    the selection of a subset of values, and
    the calculation of the output sample value is iterated such that, in each iteration:
    the selection of a current set of values from the input sample values involves selection of at least one input sample value not previously selected and discarding a corresponding at least one input sample value previously selected.

9. A signal processing device for re-sampling a signal represented by a plurality of input samples, comprising processing circuitry and memory circuitry configured to calculate an output sample value for a desired time instant between any two time instants of the input, and configured to:
    select a current set of values from the input sample values,
    calculate a new set of values by up-sampling the current set of values,
    select a subset of values from the calculated new set of values and the current set of values surrounding the time instant of the output sample value,
    calculate the output sample value using at least one value of the selected subset values, and configured to:
    iterate, a specific number of times, the calculation of a new set of values and the selection of a subset of values from the new set and the current set, wherein during the iteration the current set of values is set to the selected subset of values, wherein the processing circuitry and memory circuitry comprises:

a set of serially coupled delay elements configured to store input samples representing a signal, a first set of constant multipliers coupled to the delay elements, each multiplier configured to multiply a value by a factor specified by the ideal sinc function at +/−(x+0.5) where x is an integer, at least a second set of constant multipliers coupled to the first set of multipliers, each multiplier configured to multiply a value by a factor specified by the ideal sinc function at +/−(x+0.5) where x is an integer, and a multiplier unit coupled to a last of the second set of constant multipliers, configured to perform bilinear interpolation of at least two values.

10. The signal processing device of claim 9, where the processing circuitry and memory circuitry comprises:

a sample storage element configured to store input samples representing a signal, a set of two constant multipliers coupled to the sample storage element, each multiplier configured to multiply a value by a factor specified by the ideal sinc function at +/−(x+0.5) where x is an integer, register circuitry configured to store output values from the set of multipliers, multiplexing circuitry coupled to the set of multipliers and the register circuitry, the multiplexing circuitry being configured to time multiplex input samples to the set of multipliers, a multiplier unit coupled to the register circuitry, configured to perform bilinear interpolation of at least two values.

* * * * *

UNITED STATES PATENT AND TRADEMARK OFFICE
CERTIFICATE OF CORRECTION

| | | |
|---|---|---|
| PATENT NO. | : 8,538,713 B2 | Page 1 of 1 |
| APPLICATION NO. | : 12/964969 | |
| DATED | : September 17, 2013 | |
| INVENTOR(S) | : Bilgin et al. | |

It is certified that error appears in the above-identified patent and that said Letters Patent is hereby corrected as shown below:

In the Claims

In Column 11, Line 44, in Claim 1, delete "sent" and insert -- set --, therefor.

In Column 12, Line 8, in Claim 4, delete "claims" and insert -- claim --, therefor.

In Column 12, Line 29, in Claim 6, delete "claims" and insert -- claim --, therefor.

In Column 12, Line 33, in Claim 7, delete "claims" and insert -- claim --, therefor.

In Column 12, Line 61, in Claim 9, delete "subset values," and insert -- subset of values, --, therefor.

Signed and Sealed this
Fourth Day of February, 2014

Michelle K. Lee
*Deputy Director of the United States Patent and Trademark Office*